United States Patent [19]
Barnes

[11] Patent Number: 6,005,184
[45] Date of Patent: Dec. 21, 1999

[54] SOLAR PANELS HAVING IMPROVED HEAT DISSIPATION PROPERTIES

[75] Inventor: Kevin M. Barnes, Sunnyvale, Calif.

[73] Assignee: Space Systems/Loral, Inc., Palo Alto, Calif.

[21] Appl. No.: 08/891,538

[22] Filed: Jul. 11, 1997

[51] Int. Cl.⁶ ............... H01L 31/0203; H01L 31/024
[52] U.S. Cl. ............... 136/246; 136/244; 136/259; 136/292
[58] Field of Search ............... 136/245, 246, 136/259, 292

[56] References Cited

U.S. PATENT DOCUMENTS

| | | | |
|---|---|---|---|
| 2,742,387 | 4/1956 | Giuliani | 154/110 |
| 2,989,575 | 6/1961 | Wallace, Jr. | 136/89 |
| 4,056,405 | 11/1977 | Varadi | 136/89 |
| 4,101,101 | 7/1978 | Barkats et al. | 244/173 |
| 4,394,529 | 7/1983 | Gounder | 136/245 |
| 4,562,441 | 12/1985 | Beretta et al. | 343/781 P |
| 4,635,071 | 1/1987 | Gounder et al. | 343/897 |
| 4,755,231 | 7/1988 | Kurland et al. | 136/244 |
| 5,332,030 | 7/1994 | Spencer et al. | 165/32 |
| 5,368,654 | 11/1994 | Bergevin et al. | 136/251 |
| 5,419,781 | 5/1995 | Hamakawa et al. | 136/244 |
| 5,614,033 | 3/1997 | Robinson et al. | 136/246 |

*Primary Examiner*—Alan Diamond
*Assistant Examiner*—Michael C. Miggins
*Attorney, Agent, or Firm*—Perman & Green, LLP

[57] ABSTRACT

Solar panels having a lightweight honeycomb core as a support for an upper surface array of solar cells. The upper surface of the core is bonded to an upper insulation/faceskin laminate, and the lower surface of the core is bonded to a heat dissipation/faceskin laminate having an undersurface for absorbing heat from the solar cells and dissipating the heat into space for cooler operation and increased power efficiency of the solar panel. The invention resides in the use of a heat dissipation layer of curable resin and carbon powder having increased heat-emission properties.

9 Claims, 1 Drawing Sheet

SOLAR PANELS HAVING IMPROVED HEAT DISSIPATION PROPERTIES

BACKGROUND OF THE INVENTION

Field of the Invention

The present invention relates to solar array panels or collectors, which absorb-solar energy and convert it to electrical energy to power associated electrical components, such as output multiplexers, R.F. switches and combiners, and similar power hardware in a spacecraft or communications satellite.

State of the Art

It is known that solar panels or collectors on a spacecraft, more specifically the solar cells thereof, operate or perform more efficiently at lower temperatures, to supply more energy for the operation of the spacecraft. Therefore, known solar panels or collectors, comprising elongate, lightweight support panels for a plurality or array of photovoltaic cells are designed to absorb solar energy and to convert it to electrical power which is conducted to energize components on the spacecraft, such as traveling wave tubes, radio frequency switches, output multiplexers, etc., some of which components degrade rapidly at high temperatures.

It is desirable to design solar panels so that they emit or release the excess absorbed heat from their rear, continuously-shaded surfaces, back into space to improve the efficiency of the solar cells, present on the front, continuously-sun-exposed surfaces, and to reduce the temperature of the solar panels and reduce heat conductivity to the satellite or spaceship and to the temperature-sensitive electrical components thereon.

State of the Art

It is known to produce solar panels having a strong, lightweight honeycomb support, such as of aluminum, and to provide such solar panels with an upper insulating layer faceskin laminate bonded to the upper surface of the honeycomb support, beneath the solar cell array layer, to insulate the solar cell array from the honeycomb support, and to provide the opposite surface of the honeycomb support with a faceskin comprising a laminate of one or more layers or plies of graphite/epoxy resin and a smooth-surfaced outer heat emissive surface layer consisting of the epoxy or similar resin. Said faceskin laminate is preformed and cured, and bonded to the opposite surface of the honeycomb support by means of an adhesive layer. The purpose of the lower faceskin laminate is to absorb heat from the solar panels and emit or dissipate it from the back surface thereof to provide cooler operating temperatures for the solar cells and higher power efficiency and output.

SUMMARY OF THE INVENTION

The present invention relates to cooler operating solar panels which operate at higher power efficiency and output, due to their improved rear surface heat emissivity of up to about 90%.

The invention involves the discovery that the rear surface heat emissivity properties of the prior known solar panels can be improved to a substantial and unexpected extent by the substitution of a carbon powder-filled resin layer as the outer heat-emissive layer of the lower faceskin of the solar panel in place of the prior used neat resin layer. Such substitution has been found to increase the efficiency of the heat emission from about 78% up to about 90%, for substantially improved power efficiency and output of the solar cells supported on the upper surface of the solar panels.

THE DRAWINGS

In the accompanying drawings.

DETAILED DESCRIPTION

Figure 1:
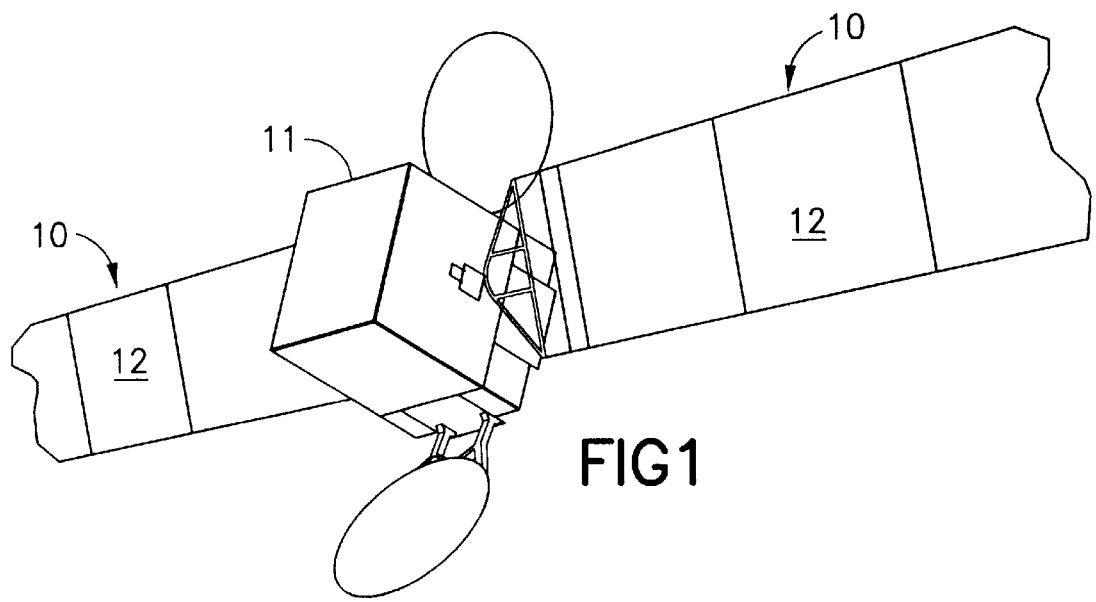
FIG. 1 is perspective view of a solar-powered spacecraft, illustrating the extended solar panels thereon.

Referring to FIG. 1, the present solar panels 10 are designed to be deployed into extension while adjustably attached to a spacecraft 11, such as a communication satellite, in order to expose an array of solar cells mounted on the face surfaces 12 of the solar panels 10 to the sun, and convert the absorbed solar energy into electrical power. The electrical power is transferred to the spacecraft 11 to power electrical components thereon.

Figure 2:
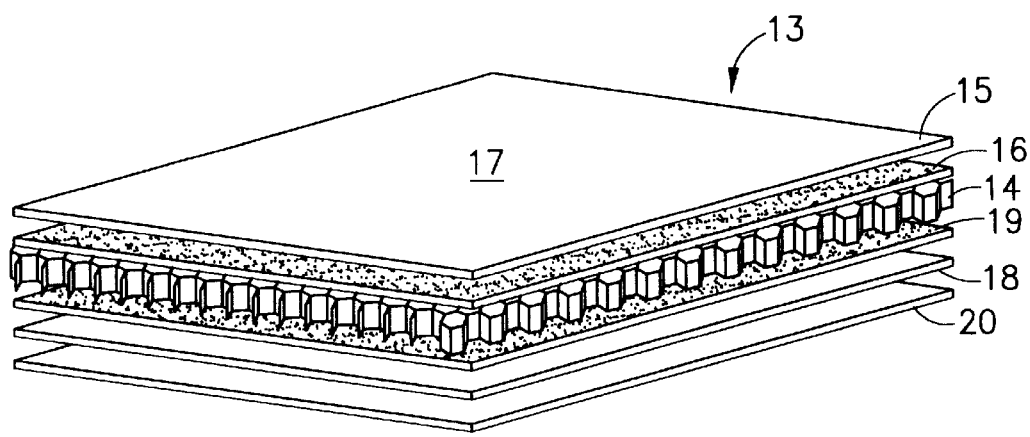
FIG. 2 is a perspective assembly view of a section of the sandwich structure of the novel solar panels of the present invention.

FIG. 2 illustrates the various components of the present solar panels, separated from each other for purposes of illustration. The central supporting structure of the bonded honeycomb sandwich construction 13 is a conventional strong integral honeycomb core 14. The core 14 supports a conventional upper insulating/faceskin laminate 15 bonded to the upper surface thereof by a conventional adhesive layer 16, and a conventional upper layer or bank of solar cells (not shown) bonded to the upper surface 17 of the composite insulating/faceskin laminate 15.

The core 14 also supports a lower faceskin layer or layer laminate comprising one or more heat-curable prepreg layers 18 and a lower heat dissipating layer 20, shown spaced in FIG. 2 for illustration purposes, bonded to the undersurface of the core 14 by means of a conventional lower adhesive layer 19.

The essential novelty of the present invention resides in the use of a heat-absorbing and dissipating rear surface layer 20 of a conventional heat-curable resin, such as an epoxy or cyanate ester resin, containing from about 1% up to about 5% by weight of carbon powder.

Figure 3:
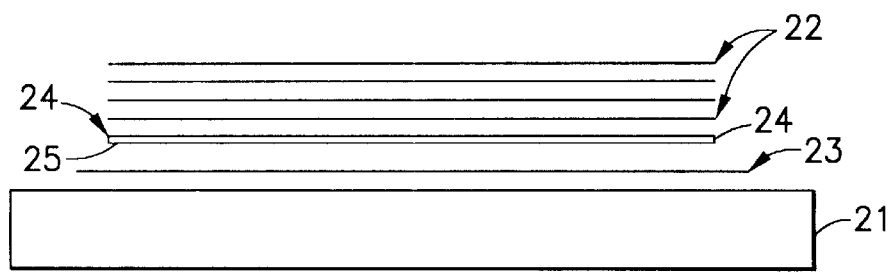
FIG. 3 is a side view illustrating the production of a lower faceskin/dissipation layer laminate over a release layer and a cure fixture, according to the present invention.

A preferred method for producing the lower heat dissipation/faceskin laminates of the present invention is illustrated by FIG. 3. A conventional cure fixture 21 is provided which is heated to the required temperature for curing the particular resin systems of the lower faceskin layers 18 and heat emissive rear surface layer 20 which temperature generally ranges between about 250° and about 350° F.

The graphite/resin faceskin layers 22, corresponding to ply 18 of FIG. 2 conveniently are purchased as preformed, semi-cured, self-supporting thin tacky prepreg layers, consisting of 60% graphite fiber/40% epoxy resin.

A textured surface release layer 23, such as of Teflon (polytetrafluorethylene) coated woven nylon fabric, which is an unsupported tacky layer, 1 to 2 mils thick, commercially-available under the designation "Peel Ply", is first applied to the upper heated surface of the cure fixture 21. Then a heat-dissipating base layer 24, such as of heat-curable epoxy resin containing about 3% by weight of powdered carbon is coated over the release layer 23.

Next one or more prepreg layers 18, such as four layers 22 as illustrated in FIG. 3, are applied over the heat-dissipation base layer 20 or 24, and the multi-ply composite laminate is heat cured.

The cured lower faceskin/heat dissipation layer laminate is removed from the release surface to form a lower composite faceskin ready for attachment to the honeycomb core 14 shown in FIG. 2. The undersurface 25 of the carbon-filled heat dissipation layer 20 or 24 preferably is formed as a textured, dull, flat-black surface, imparted by the fabric weave surface of the "Peel Ply" release layer 23, which is a preferred embodiment of the present invention since such a surface has been found to have better heat-emission or heat-dissipation properties than a smooth surface of the same material.

The upper surface of the composite lower faceskin/heat dissipation laminate is bonded to the undersurface of the honeycomb core 14 by means of an adhesive layer 19 shown in FIG. 2, which bonds to both the core 14 and to the composite faceskin.

The composite upper insulation/faceskin laminate 15 is formed by applying a high heat-resistant layer or preformed insulation film over a cure fixture, such as a layer of polyimide resin in film form, available from Dupont under the trademark Kapton. Next one or more plies of the graphite fiber/curable polymer prepreg, such as layers 22 of FIG. 3, are applied over the Kapton insulation film, and the film and plies are cured at elevated temperature to form the composite insulation/faceskin laminate 15.

The core 14 has bonded to the upper surface thereof the upper adhesive layer 16, the composite insulation/faceskin laminate layer 15 and the layer of solar cells, to form a solar panel sandwich structure 13, shown in FIG. 2, suitable for use in solar panels 10 illustrated by FIG. 1.

Thus, the present process for producing solar panels having improved heat dissipation properties comprises the steps of:

a) providing a support core of lightweight honeycomb structure, such as of aluminum foil;

b) forming an upper insulation/faceskin laminate by superposing a heat-resistant insulation layer, such as a polyimide film, and at least one prepreg layer comprising graphite fibers and a heat-curable resin on a curing fixture, and heating to cure the prepreg layer(s) and form the laminate;

c) forming a lower heat dissipation/faceskin laminate by (1) applying a release layer, such as a textured fabric, to the surface of a heating fixture; (2) applying over the release layer a heat dissipation layer comprising a heat-curable resin and between about 1% and 5% by weight of carbon powder; (3) applying over the heat-dissipating layer at least one prepreg layer comprising graphite fibers and a heat-curable resin; (4) heating the fixture to cure the heat-dissipation layer and the prepreg layer(s) to form the heat dissipation/faceskin laminate; and (5) separating the laminate from the release layer;

(d) bonding the cured prepreg side of the upper insulation/faceskin laminate to one surface of the support core to expose the heat-resistant insulation layer as a support surface for an array of solar cells to be bonded thereto; and (e) bonding the cured prepreg side of the lower heat dissipation/faceskin laminate to the opposite surface of the support core to expose the heat dissipation layer, whereby during use in outer space excessive heat absorbed by the solar panel is preferentially absorbed into the heat/dissipation layer and dissipated therefrom into space.

Comparative testing indicates that the present panels dissipate over 12% more heat from the solar cell layer than do similar panels of identical construction except that they have a heat-emitting smooth surface base layer of epoxy resin devoid of powdered carbon.

It should be understood that the foregoing description is only illustrative of the invention. Various alternatives and modifications can be devised by those skilled in the art without departing from the scope of the present invention. Accordingly, the present invention is intended to embrace all such alternatives, modifications and variances which fall within the scope of the appended claims.

What is claimed is:

1. A solar panel comprising a support core of honeycomb structure having a composite upper insulating/faceskin laminate supporting a plurality of solar cells and having an undersurface comprising a composite heat-absorbing/faceskin laminate of at least one heat-curable prepreg layer and an outer heat-dissipating layer comprising a resinous layer containing powdered carbon.

2. A solar panel according to claim 1 in which said composite heat-absorbing/faceskin laminate comprises a laminate of at least one graphite fiber/resin prepreg layer and said outer heat-dissipating layer comprising a resinous layer containing powdered carbon.

3. A solar panel according to claim 1 in which said heat-curable prepreg layer and said outer heat-dissipating layer contain heat-curable resins selected from the group consisting of epoxy resins and cyanate ester resins.

4. A solar panel according to claim 1 in which said outer heat dissipating layer contains between about 1% and 5% by weight of the powdered carbon.

5. A solar panel according to claim 4 in which said outer heat dissipating layer contains about 3% by weight of the powdered carbon.

6. A solar panel according to claim 1 in which said outer heat-dissipating layer has a textured outer surface providing a dull, flat black appearance.

7. A solar panel according to claim 1 in which said composite upper insulating/faceskin laminate comprises an upper insulating film of heat-resistant polymer and at least one heat-curable prepreg layer comprising graphite fiber and heat-curable resin.

8. A solar panel according to claim 7 in which said upper insulating film comprises a polyimide polymer.

9. A solar panel according to claim 1 in which said honeycomb structure comprises aluminum.

* * * * *